US012484339B2

(12) United States Patent
Barbiero et al.

(10) Patent No.: US 12,484,339 B2
(45) Date of Patent: Nov. 25, 2025

(54) PHOTON SOURCE AND METHOD OF FABRICATING A PHOTON SOURCE

(71) Applicant: Kabushiki Kaisha Toshiba, Tokyo (JP)

(72) Inventors: Andrea Barbiero, Cambridge (GB); Joanna Krystyna Skiba-Szymanska, Cambridge (GB); Richard Mark Stevenson, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 496 days.

(21) Appl. No.: 17/886,794

(22) Filed: Aug. 12, 2022

(65) Prior Publication Data
US 2023/0207727 A1    Jun. 29, 2023

(30) Foreign Application Priority Data

Dec. 23, 2021 (GB) .................................. 2118970

(51) Int. Cl.
*H10H 20/814* (2025.01)
*H10H 20/01* (2025.01)
(Continued)

(52) U.S. Cl.
CPC ...... *H10H 20/8142* (2025.01); *H10H 20/013* (2025.01); *H10H 20/812* (2025.01);
(Continued)

(58) Field of Classification Search
CPC ............. H10H 20/8142; H10H 20/013; H10H 20/812; H10H 20/819; H10H 20/81;
(Continued)

(56) References Cited

U.S. PATENT DOCUMENTS

2009/0137102 A1    5/2009  Rooyackers et al.
2013/0016749 A1    1/2013  Motoda
(Continued)

FOREIGN PATENT DOCUMENTS

CN    111864537 A       10/2020
EP      4187725 A1 *    5/2023  ......... H10H 20/8142
JP    2009-117829 A     5/2009

OTHER PUBLICATIONS

Japanese Office Action issued Jan. 9, 2024 in Japanese Application 2022-136051, (with English translation), 6 pages.
(Continued)

*Primary Examiner* — Yara B Green
*Assistant Examiner* — Akhee Sarker-Nag
(74) *Attorney, Agent, or Firm* — Oblon, McClelland, Maier & Neustadt, L.L.P.

(57) ABSTRACT

A photon source comprising:
 a quantum dot; and an optical cavity,
 the optical cavity comprising:
  a diffractive Bragg grating "DBG"; and
  a planar reflection layer,
 the DBG comprising a plurality of concentric reflective rings surrounding a central disk and at least one conductive track extending from the central disk across the plurality of concentric rings, the quantum dot being provided within the central disk and the planar reflection layer being provided on one side of the DBG to cause light to be preferentially emitted from the opposing side of the DBG.

17 Claims, 10 Drawing Sheets

(51) Int. Cl.
  *H10H 20/81* (2025.01)
  *H10H 20/812* (2025.01)
  *H10H 20/819* (2025.01)
  *H10H 20/824* (2025.01)

(52) U.S. Cl.
  CPC ........... *H10H 20/819* (2025.01); *H10H 20/81* (2025.01); *H10H 20/8242* (2025.01)

(58) Field of Classification Search
  CPC ............. H10H 20/8242; H10H 20/862; H10H 20/856; H10H 20/821; H10H 20/814; H10H 20/824; H01S 5/18
  See application file for complete search history.

(56) References Cited

U.S. PATENT DOCUMENTS

| | | | |
|---|---|---|---|
| 2019/0355868 A1* | 11/2019 | Fimland | H10H 20/811 |
| 2021/0119076 A1* | 4/2021 | Ko | H10H 20/8242 |
| 2024/0170923 A1* | 5/2024 | Reitzenstein | H01S 5/3412 |

OTHER PUBLICATIONS

Japanese Office Action issued Jan. 30, 2024 in Japanese Application 2022-136051, (with partial English translation), 3 pages.

Singh et al., "Large Purcell Enhancement of a Quantum Dot Coupled to a Circular Grating in a Charge Tunable Device", arXiv:2111.13653v1 [quant-ph], Nov. 26, 2021, 6 pages.

Combined Search and Examination Report under Sections 17 and 18(3) issued May 26, 2022, in corresponding United Kingdom Patent Application No. GB2118970.9, 6 pages.

Liang Guozhen, "Single mode surface emitting concentric-circular-grating terahertz quantum cascade lasers"; Applied Physics Letters; vol. 102; No. 3; Jan. 21, 2013, pp. 31119-31119-4.

Serkan Ate et al., "Bright Single-Photon Emission from a Quantum Dot in a Circular Bragg Grating Microcavity", IEEE Journal of Selected Topics in Quantum Electronics; vol. 18; No. 6; Nov. 1, 2012; pp. 1711-1721.

Beimeng Yao et al., "Design for Hybrid Circular Bragg Gratings for a Highly Efficient Quantum-Dot Single Photon Source"; Journal of the Korean Physical Society; vol. 73; No. 10; Nov. 2018; pp. 1502-1505.

Harjot Singh et al., "Optical transparency induced by a largely Purcell-enhanced quantum dot in a polarization-degenerate cavity", Submitted on Nov. 26, 2021 (v1), last revised Apr. 7, 2022 (this version, v3), arXiv:2111.13653v3 [quant-ph], pp. 1-7 https://arxiv.org/abs/2111.13653.

N. Somaschi et al., "Near-optimal single-photon sources in the solid-state", [Submitted on Oct. 22, 2015 (v1), last revised Oct. 26, 2015 (this version, v2)] arXiv:1510.06499v2 [quant-ph], 23 pages, https://arxiv.org/abs/1510.06499.

P. Hilaire et al., "Deterministic assembly of a charged quantum dot—micropillar cavity device", arXiv:1909.02440v3 [quant-ph], Apr. 1, 2020, pp. 1-9.

Johannes Schall et al., "Bright Electrically Controllable Quantum-Dot-Molecule Devices Fabricated by In Situ Electron-Beam Lithography", Advanced Quantum Technologies, 2021, 7 pages.

S. A. Blokhin et al., "Design optimization for bright electrically-driven quantum dot single-photon sources emitting in telecom O-band", Optics Express, vol. 29, No. 5, Mar. 2021, pp. 6582-6598.

Lucas Rickert et al., "Optimized designs for telecom-wavelength quantum light sources based on hybrid circular Bragg gratings", Optics Express vol. 27, Issue 25, pp. 36824-36837 (2019), 13 pages https://opg.optica.org/oe/fulltex.cfm?uri=oe-27-25-36824&id=423857.

Magdalena Moczala-Dusanowska et al., "Strain-Tunable Single-Photon Source Based on a Circular Bragg Grating Cavity with Embedded Quantum Dots", ACS Publications, 2020, pp. 3474-3480.

Japanese Statement of Opposition issued Jan. 7, 2025 in Japanese Patent Application No. 7490719, (with partial English translation), citing documents 24-25 therein, 50 pages.

Chen, G et al., "Biexciton Quantum Coherence in a Single Quantum Dot", Physical Review Letters, vol. 88, No. 11, Mar. 18, 2002, 4 pages.

Ghali, M et al., "Generation and control of polarization-entangled photons from, GaAs island quantum dots by an electric field", Nature Communications, vol. 3, No. 661, Feb. 7, 2012, pp. 1-6.

* cited by examiner

304

PHOTON SOURCE AND METHOD OF FABRICATING A PHOTON SOURCE

The above application claims priority from GB application number GB 2118970.9 which is hereby incorporated by reference.

FIELD

Embodiments described herein relate to a photon source and a method of fabricating a photon source.

BACKGROUND

Photon sources are required for a large number of different uses. Some photon sources that use quantum dots can be used as single photon emitters or quantum light sources. Single photon emitters are used to emit single photons, quantum light sources can emit single photons, entangled photons or a number of photons, the number of photons being controlled to the accuracy of a single photon.

Such single photon sources and quantum light sources can be used for quantum LEDs, Quantum LED modules, quantum key distribution (QKD) and quantum communication systems: components such as quantum relays, quantum repeaters etc.

DETAILED DESCRIPTION OF DRAWINGS

Figure 1A:
FIG. 1A is a cross section of the layer structure of a photon source in accordance with an embodiment.

In an embodiment, photon source is provided, the photon source comprising: a quantum dot; and an optical cavity, the optical cavity comprising: a diffractive Bragg grating "DBG"; and a planar reflection layer, the DBG comprising a plurality of concentric reflective rings surrounding a central disk and at least one conductive track extending from the central disk across the plurality of concentric rings, the quantum dot being provided within the central disk and the planar reflection layer being provided on one side of the DBG to cause light to be preferentially emitted from the opposing side of the DBG.

The above photon source can provide a sub-Poissonian photon source, the conductive tracks allowing an electric field to be applied. Further, the recited configuration allows Purcell enhancement to occur which will improve the extraction efficiency over a broad wavelength range.

In an embodiment, the photon source is a semiconductor photon source. The DBG may be an elliptical Bragg grating where the plurality of concentric rings are ellipses. The ellipses may be circles such that a circular Bragg grating CBG is provided.

In an embodiment, the planar reflection layer is a metal reflection layer. In a further embodiment, the planar reflection later is provided by a dielectric mirror such as a distributed Bragg reflector (DBR). However, a metallic mirror guarantees high reflectivity from a broad range of wavelengths and incident angles compared to semiconductor distributed Bragg reflectors The below description refers to circular Bragg gratings. However, other types of elliptical Bragg gratings or other structures with concentric rings could be used.

In a further embodiment, the quantum dot is provided in a semiconductor layer and a dielectric spacer layer is provided between the quantum dot and the planar reflection layer. In an embodiment, the dielectric spacer layer has a lower refractive index that the semiconductor layers. The dielectric spacer layer functions to avoid plasmonic effects that would take place at a direct semiconductor/metal interface and ensures that there is the right distance between the QDs and the mirror. Therefore, the thickness of this layer is optimized for operational wavelength and material system.

The provision of a dielectric spacer layer allows the layer to be used as an etch stop when performing later fabrication steps that will be described below.

The plurality of reflective rings comprise a plurality of trenches. In an embodiment, there are at least 2 concentric rings. The function of the concentric rings is to concentrate the electric field within the central disk. Therefore, more rings are possible, for example from 5 to 50 or even more.

In an embodiment, the width of the trenches is 50 nm and 600 nm. The separation between the trenches of the order of A, where A is the effective emitting wavelength of the quantum dot. For the avoidance of doubt, in an embodiment, the separation is the portion of semiconductor between two trenches.

In an embodiment, the quantum dot is provided in an undoped or intrinsic semiconductor layer, the undoped semiconductor layer being provided between a p-doped semiconductor layer and an n doped semiconductor layer, the trenches extending through the undoped semiconductor layer, the p-doped semiconductor layer and the n doped semiconductor layer, the at least one conductive track being provided by bridge of semiconductor material comprising at least one of the n-doped semiconductor material and/or the p-doped semiconductor material.

The above arrangement allows an electric field to be applied across the quantum dot which will allow the quantum dot to emit radiation. The electric field can be applied by contacting the n-doped semiconductor layer and the p-doped semiconductor layer provided under the central disk. Contact to the n-doped and p-doped layers within the central disk can be achieved via the bridges.

In an embodiment, the trenches are etched trenches and the bridges of semiconductor material is a non-etched region. This allows the n-type region and the p-type region to extend across the CBR. It is possible for one of the n-type or p-type region to be removed from the bridge. For example, there may be provided an arrangement with two bridges where there is first bridge with an n-type layer and no p-type layer and a second bridge with either both n-type and p-type layers or just a p-type layer. The alternate arrangement is also possible where the first bridge comprises a p-type layer and no n-type layer and the second bridge comprises both p-type and n-type or just n-type.

In an embodiment, the trenches extend to the dielectric spacer layer and the dielectric spacer layer functions as an etch stop layer. This allows ease of fabrication.

In an embodiment, an n-type contact is provided to the n-type doped layer and a p-type contact is provided to the p-type doped layer at the edge or outside the edge of the outermost concentric ring. This allows contact to be made without the contact metalisation affecting the properties of the CBR.

In an embodiment, there are a plurality of bridges extending from said central disk in a radial manner. However, it is also possible for there to be a single bridge where there is independent contact made to the n-type layer and p-type layer using said single bridge.

In an embodiment, there is a plurality of bridges and the bridges are arranged in a rotationally symmetric manner around the central disk.

The width of a bridge may be at least 150 nm and at most 500 nm. The width of the trenches may be at least 50 nm and at most 600 nm.

In an embodiment, the width of a bridge is constant along a radial direction of the concentric rings. The bridge will cause reflections of the optical field in addition to those reflections caused by the rings of the CBR which may negatively affect the confinement provided by the CBR. In an embodiment, the provision of bridges with a constant width allows better quality control as the dimensions of the bridge can be easily checked to see if they match the design values. If the width of the bridge is constant, it will be much easier to confirm that there is no offset or variation along the structure.

In an embodiment, the photon source is provided such that the Purcell factor is >3. In a further embodiment, the photon extraction efficiency>40% over a broad wavelength range >5 nm.

The above may be achieved by a photon source that comprises one or more of:
  a plurality of quantum dots emitting in the wavelength range 700-2000 nm
  within a semiconductor layer of thickness $\lambda/4$ to $2*\lambda$ where $\lambda$ is the effective emitting wavelength within the layer
  a central mesa with diameter between $\lambda/2$ and $5*\lambda$.
  a series of 2 or more concentric trenches within said semiconductor layer of width >50 nm and <1000 nm
  where said trenches are interrupted by one or more semiconductor bridges that connect the central mesa
  a dielectric spacer layer underlying and in contact with the above, with refractive index lower than said semiconductor layer
  a reflecting layer underlying and in contact with the above, The above system can be used in many different material systems. The GaAs or InP material systems allow the formation of quantum dots with commercially useful wavelength ranges such as from 1250 nm to 1560 nm, for example around 1310 nm and 1550 nm. In an embodiment, the values of 1310 nm and 1550 nm are provided as approximate values with an error of 10%, or in further embodiments, 5%.

In a yet further embodiment, an optical fibre is provided which is positioned to collect radiation emitted from the quantum dot.

In a further embodiment, a method of fabricating a photon source is provided the method comprising:
  forming a sacrificial layer overlying a first substrate;
  forming first doped semiconductor layer overlying the sacrificial layer;
  forming an undoped semiconductor layer comprising quantum dots overlying the first doped semiconductor layer;
  forming a second doped semiconductor layer overlying the undoped semiconductor layer, the second doped semiconductor layer having an opposing polarity type to the first doped semiconductor layer;
  forming a dielectric layer overlying the second doped semiconductor layer;
  forming a metal layer overlying the dielectric layer;
  forming a metal layer overlying a second substrate;
  flip chip bonding the metal layer overlying the first substrate to the metal layer overlying the second substrate to form a bonded structure;
  removing the first substrate and sacrificial layer from the bonded structure;
  forming a pattern of concentric rings surrounding a central disk on the surface exposed by the step of removing the sacrificial layer, said pattern also comprising at least one bridge extending radially from the central disk, the pattern being formed by etching; and
  forming contacts to the two doped semiconductor layers.

In an embodiment, the pattern is etched down to the dielectric layer. In a further embodiment, contacts are formed to the doped semiconductor layers, the contacts being formed at the end of the outer concentric ring.

The term "flip chip" is used above, it should be understood that 'chip' can mean semiconductor piece of any size, including full wafers.

In a yet further embodiment, the contacts are formed, prior to the etching of the pattern.

Figure 1B:
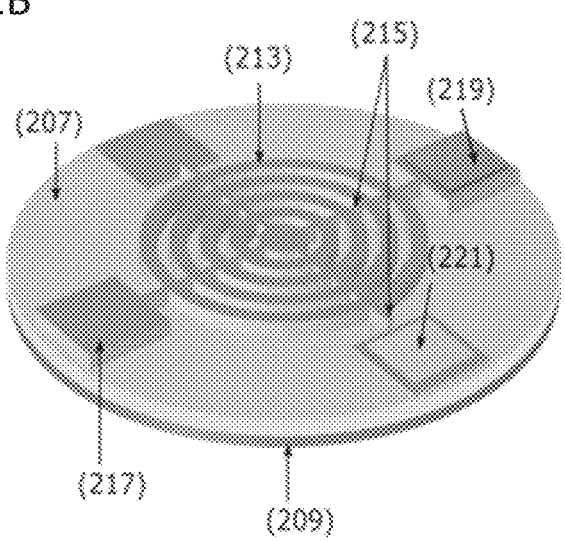
FIG. 1B is a plan view of a photon source in accordance with an embodiment.

FIG. 1A is a schematic of a cross section of a photon source in accordance with an embodiment and FIG. 1B is a plan view of a photon source in accordance with an embodiment.

The photon source 1 comprises quantum dots (QDs) 201 grown in a 400 nm-thick InP slab 203. The slab includes two 50 nm-thick doped layers, n-doped layer 205 and p-doped layer 206. N-doped layer 205 is n-type doped with Si, while p-doped layer 206 is p-type doped with Zn.

Although, in this embodiment, the thickness of the p-doped layer 206 is designed to be 50 nm the real layer thickness is larger due to Zn diffusion into InP at high temperatures.

An insulating layer of $SiO_2$ 207 separates the bottom of the slab from a broadband backside Au mirror 209, and acts as a stop layer during the etching process. Mirror 209 acts as a mirror used to define an optical cavity.

The mirror 209 sits on an InP carrier wafer 211. However, the carrier wafer may be a different material, for example, Si. If the sample is fabricated in GaAs, a GaAs wafer or an Si Wafer could be used.

FIG. 1B is a plan view of the photon source. The source described with reference to FIG. 1A and FIG. 1B, is designed to operate in the telecom C-band. On the upper surface of the photon source 1, there is a circular Bragg grating (CBG). A circular Bragg grating (CBG) consists of a set of concentric trenches etched in a semiconductor slab around a central mesa with quantum dots (QDs). Under optical or electrical pumping, the QDs can emit single photons that are mostly confined by total internal reflection and therefore guided in the semiconductor slab.

When photons propagate in the slab, the refractive index contrast at the trenches causes strong in-plane reflections, leading to a cavity resonance localized in the central mesa. Meanwhile, part of the in-plane emission is directed vertically by the concentric rings, which meet the second-order Bragg condition.

Since half of the emitted photons would be dispersed in the substrate, the device includes a backside broadband mirror separated from the CBG by an insulating oxide layer 207. If the thickness of the oxide layer is properly designed, the majority of the photons leaking into the substrate can be effectively reflected from the mirror 209, which may be formed of Au or Ag, and redirected upwards, where the bright emission can be collected with high efficiency by an objective lens or the like.

In this embodiment, the CBG comprises 4 concentric trenches 213 etched in the InP slab. The concentric trenches 213 surround a non-etched central disk.

The trenches 213 are interrupted by 4 semiconductor bridges 215 of width $w_b$ that connect the central disk to 4 InP mesas 217 (not to scale in this drawing) placed outside the device where the metal contacts are deposited. (219) is a metal contact to n-InP (221) is a p-type contact. Both contacts are made of PdGePtAu.

With small adjustments of the layer thicknesses, the above design can be transferred to the GaAs material system to obtain a device operating in the near infrared or in the telecom O-band. In this case, the p-type layer is doped with C, the n-type contact is made of PdGePtAu and the p-type contact is made of CrAu or TiAu.

Simulations of the above device design is shown below:

| Device | Material | Wavelength (nm) | $F_p$ | FWHM (nm) | NA | Collection efficiency | Electric field control |
|---|---|---|---|---|---|---|---|
| Modified hybrid CBG | InP | 1550 | 20 | 10 | 0.65 | ~70% | Yes |

The table above shows simulated results from the device design described with reference to FIGS. 1A and 1B. The table specifies the material system, the operational wavelength, the Purcell factor $F_p$, the bandwidth (FWHM) of the cavity mode and the fraction of generated photons that are successfully collected in a certain numerical aperture (NA). It should be noted that the above device combines moderate Purcell enhancement and high extraction efficiency in a broad range with electric field control.

A fabrication process will now be described with reference to FIGS. 2A to 2F. The process shown here uses a so-called 'flip-chip' method, but other methods could be used. It should be noted that 'chip' can mean semiconductor piece of any size, including full wafers.

Figure 1C:
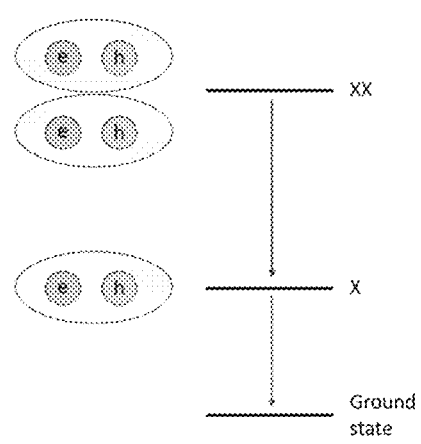
FIG. 1C is a simplified band diagram of a quantum dot.

For completeness, FIG. 1C shows an energy level diagram of a quantum dot of the type that can be used in the photon sources of FIGS. 1A and 1B and is used to explain the operation.

A quantum dot (QD) is a small structure with the capability to confine charged particles within a reduced volume, such that quantization of the energy levels arises.

In semiconductor quantum dots (such as the InAs/InP or InAs/GaAs QDs included in the CBG) this effect can be achieved by embedding a small-bandgap semiconductor in a high-bandgap matrix and therefore creating a potential well that traps electrons and holes. As a result, the dot contains a few discrete levels in the conduction and valence bands, each of which can be populated by two electrons or holes of opposite spin. The confinement of an electron-hole pair inside the QD is bound through the Coulomb interaction and commonly referred to as an exciton (X) state, while two excitons in the same dot are collectively called biexciton (XX).

Due to their confinement capability, quantum dots can be exploited to generate single photons. In fact, after the injection of charge carriers, the XX excited state decays spontaneously with a radiative cascade: first, one of the electrons recombines with one of the holes and generates the biexciton photon. This leaves the dot in the X state, which subsequently decays to the ground state generating a second photon (exciton photon).

FIG. 1C is a simplified diagram and, in practice, the level of the X state is split into two optically active states $X_1$ and $X_2$ depending on the electron and hole spins. An energy difference between the two exciton spin states may be present. The presence of the two X states provides two decay paths, one from XX to $X_1$ to ground and the other from XX to $X_2$ to ground. This allows the system to emit photons in a superposition of these paths, leading to generation of polarisation entangled photons.

As a result of the Coulomb interaction between carriers, the wavelengths of the X and the XX photons differ by a few nanometers and therefore they can be observed as two distinct individual spectral lines using low temperature spectroscopy. Moreover, the emission spectrum typically displays a few additional lines originating from alternative charge configurations. It is also possible to excite other emitting states in the quantum dot, for example a negatively charged exciton consisting of a pair of electrons and single hole, which will emit a single photon with wavelength different to that of the neutral excitation and biexciton, leaving an electron in the quantum dot.

In the device of FIGS. 1A and 1B, the photons emitted by the QD are mostly confined by total internal reflection at the semiconductor interface and therefore guided in-plane. When photons propagate in the slab and reach the grating, the refractive index contrast at the trenches causes strong in-plane reflections, leading to a cavity resonance localized in the central mesa. Meanwhile, part of the in-plane emission is directed vertically by the concentric rings, which meet the second-order Bragg condition.

Since half of the emitted photons would be dispersed in the substrate, the device includes a backside broadband mirror separated from the CBG by an insulating oxide layer. If the thickness of the oxide layer is properly designed, the majority of the photons leaking into the substrate can be effectively reflected from the gold mirror and redirected upwards, where the bright emission can be collected with high efficiency by an objective lens or directly coupled into an optical fibre. Varying the thickness of the oxide layer influences the optical path difference between the photon directed upwards by the grating and the photons reflected by the mirror, therefore it directly affects the radiation pattern and the bandwidth of the device.

After spectral filtering, an external system may use the single photons collected from the device as a resource for quantum communication or quantum computing.

In order to trigger the recombination cascade, the QDs embedded in the device of FIGS. 1A and 1B are populated with charge carriers. This can be achieved using optical or electrical injection.

In optical excitation electrons are excited from the valence to the conduction band by illuminating the QDs with photons generated by a CW or pulsed laser source. Depending of the photon energy of the laser source, 3 different schemes can be distinguished:

Above-band excitation when the energy of the pumping laser is higher than the bulk material band gap. In this scheme electrons and holes are excited over the band edge of the barrier material and then captured by the QD, where they lower their energy via phonon interaction and eventually reach a radiative state and recombine.

Quasi-resonant excitation if the energy of the pumping laser matches the energy difference between higher order states within the QD or the energy of LO phonon resonances.

Resonant excitation when the incoming photon energy is tuned on resonance with a given optical transition. The light emitted under resonant excitation is known as resonance fluorescence (RF). Since the excitation wavelength is the same as the emission wavelength, this technique requires optimized suppression of the pump laser.

Since the device of 1A and 1B includes doped layers, with QDs grown in the intrinsic region of a p-i-n structure, it is also possible to populate the excited states by applying an external voltage and therefore creating an electric current that flows through the device.

In particular, short electrical pulses can be applied by alternating between a high and low voltage. For the InP material system, a suitable high voltage would be ~1.5V and low ~0.5 V with pulse width on the order of 100 ps FWHM. During the high voltage phase, a single electron and hole will be captured from the current passing into the QD, while during the off phase they will recombine to emit single photons.

For experimental applications it may be necessary to modify the emission wavelength of the QDs. The device of FIGS. 1A and 1B is compatible with the following tuning schemes:

Temperature tuning where the emission wavelength is redshifted for increasing temperatures up to tens of degrees K.

Electric field tuning where the electric field generated by the application of a voltage across the device can modify the emission wavelength thanks to the quantum-confined Stark effect.

Figure 2A:
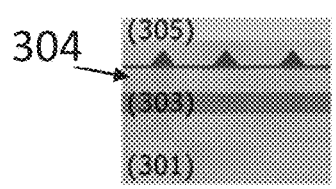
FIGS. 2A to 2F are fabrication steps for forming the layer structure of a photon source, in the InP system, in accordance with an embodiment.

In FIG. 2A, a 400 nm-thick InP slab 304 is grown by metalorganic vapor-phase epitaxy MOVPE on a conventional InP(001) substrate 301 which will be termed a first substrate. The slab may also be grown by molecular beam epitaxy (MBE) or metalorganic chemical vapor-phase epitaxy MOVPE. A 900 nm AlInGaAs or InGaAsP sacrificial layer 303 is formed on the first substrate prior to forming the InP layer.

The InP slab comprises a first doped InP layer which is formed overlying the sacrificial layer. The InP slab comprises a first doped InP layer, a central InP region formed overlying the first doped InP layer, and a second doped InP layer overlying the central region.

The quantum dots are formed in the central region. The device includes InAs\InP QDs grown by metalorganic vapor-phase epitaxy (MOVPE). The QDs can be formed using different techniques:

1) The Stranski-Krastanow (SK) method relies on lattice mismatch between different semiconductors.

In this growth mode, As and In fluxes are supplied to the substrate at the same time. Initially, growth is two dimensional, and a highly strained InAs wetting layer is formed. The strain, caused by lattice mismatch between the InAs and the InP substrate, increases with the thickness of the wetting layer. After a critical thickness, the growth stops being uniform and QD islands start to form in order to minimize the surface tension.

2) Droplet epitaxy (DE), on the other hand, does not rely on strain during QD formation. Instead, In and As fluxes are supplied separately at a lower temperature compared to SK QDs.

First, group III metallic elements such as In, are deposited on the substrate surface, leading to the spontaneous formation of nanometre-scale droplets. At this stage, it is possible to control the droplet density and size by changing either the temperature of the substrate or the total amount of material deposited per unit area. Once this step is completed, the metal source is closed and the growth continues with the crystallization of the metallic droplets by irradiation of the desired non-metallic group V element, such as As.

During this second step each single metal droplet becomes the starting point of one nanostructure, whose shape and topology can be controlled by varying the parameters of the process It is worth noting that, with small adjustments of the layer thicknesses and the fine features, the design can be transferred to the telecom O-band or the infrared wavelength range and operate with InAs/GaAs QDs. In this case, the sample can be grown by molecular beam epitaxy (MBE) and QDs can be formed in either SK or DE mode.

Other techniques could also be used for forming the dots, for example, local droplet etching (LDE).

A 280 nm layer 305 of $SiO_2$ is deposited on top of the slab using plasma enhanced chemical vapour deposition (PECVD).

Figure 2B:
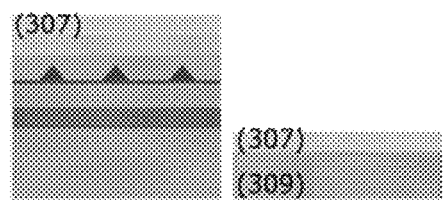

In FIG. 2B, 300 nm of Au 307 are sputtered on top of both the SiO2 layer 305 and on a second substrate, InP(001) carrier wafer 309.

Figure 2C:
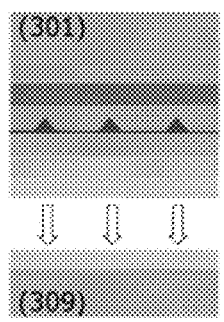
Figure 2D:
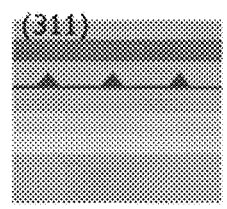

In FIG. 2C, the first substrate and layers are flipped and bonded to the second substrate using thermocompression Au—Au bonding. In FIG. 2D, the majority of the original InP substrate is removed by mechanical lapping and polishing, leaving a residual thickness of approximately 25 µm 311.

Figure 2E:
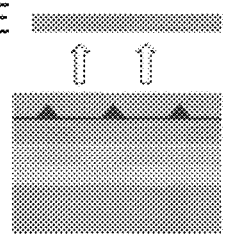
Figure 2F:
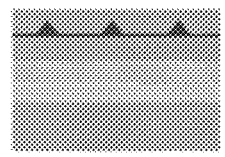

In FIG. 2E, a solution of $H_2SO_4:H_2O_2:H_2O$ with ratio 1:1:8 is used to selectively etch the sacrificial layer, removing the residual InP first substrate. In FIG. 2F, the final structure is cleaved in chips for device fabrication.

Figure 3A:
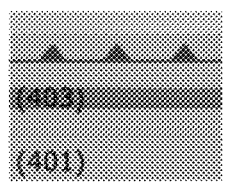
FIGS. 3A to 3F are fabrication steps for forming the layer structure of a photon source, in the GaAs system, in accordance with an embodiment.
Figure 3B:
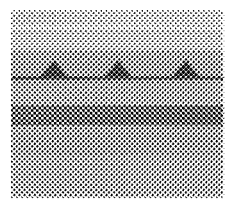

The above technique is adapted for InP systems. FIGS. 3A to 3B shows the flip chip method for GaAs based systems.

In FIG. 3A, first structure is formed, the first structure comprises a 200 nm $Al_{0.8}Ga_{0.2}As$ sacrificial layer 303 that is formed overlying and in contact with a first substrate which is a conventional GaAs(001) substrate 401. The sacrificial layer 403 is formed using molecular beam epitaxy. A doped GaAs slab with QDs is grown by Molecular Beam Epitaxy on the sacrificial layer 403. A layer of SiO2 is deposited on top of the slab using PECVD.

In FIG. 3B, 300 nm of Au are sputtered on top of both the $SiO_2$ formed of the first structure and on an GaAs(001) or Si carrier wafer 405 which will be termed the second substrate.

Figure 3C:
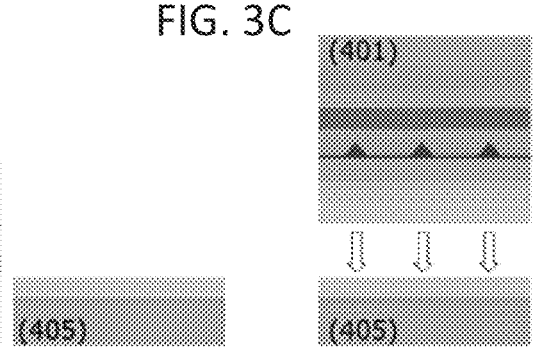

In FIG. 3C, the first structure is flipped and bonded to the Au on the second substrate using thermocompression Au—Au bonding.

Figure 3D:
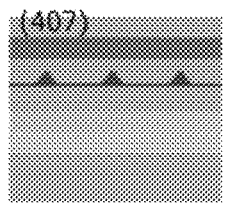
Figure 3E:
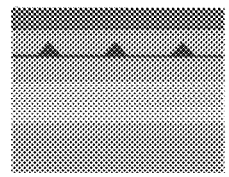
Figure 3F:
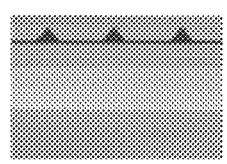

In FIG. 3D, the majority of the original GaAs substrate is removed by mechanical lapping, leaving a residual thickness of approximately 25 μm 407. In FIG. 3E, the residual GaAs is etched in a selective solution of $C_6H_6O_7:H_2O_2$ with ratio 5:1, which stops at the $Al_{0.8}Ga_{0.2}As$ sacrificial layer. In FIG. 3F, the dipping of the structure in diluted HCl dissolves the sacrificial layer, yielding the final wafer structure.

FIGS. 2 and 3 show how the basic layer structure can be formed using a flip chip technique. FIGS. 5 and 6 will now explain how the layer structure is processed to form the hybrid CBG.

Figure 4A:
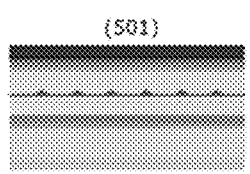
FIGS. 4A to 4M are fabrication steps for patterning the layer structure of FIG. 2F.

FIGS. 4A to 4M is a schematic of the workflow for the fabrication of the proposed device on starting from the InP bonded wafer structure presented in FIGS. 2A to 2F. In FIG. 4A, the InP slab is covered with a layer of PMMA or ZEP resist 501.

Figure 4B:
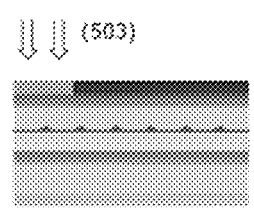
Figure 4C:
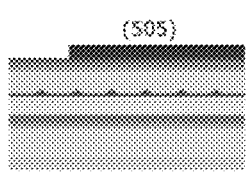

In FIG. 4B, the resist covered wafer structure is exposed to an electron-beam 503 to define the area where the p-type contact will be deposited. In FIG. 4C, the resist is developed in a solvent that removes the exposed resist creating the first mask 505.

Figure 4D:
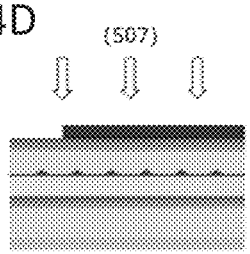
Figure 4E:
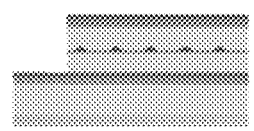
Figure 4F:
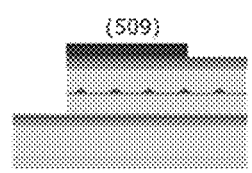

In FIG. 4D, the sample is dry-etched with inductively coupled plasma using chlorine chemistry, stopping at the p-doped layer. In FIG. 4E, the resist mask is removed by washing the sample in acetone or Microposit Remover 1165. In FIG. 4F, a second resist mask 509 is created by following the same procedure illustrated in FIGS. 4A to 4C.

Figure 4G:
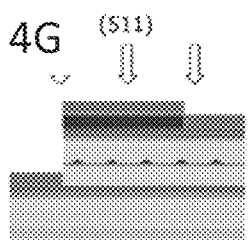
Figure 4H:
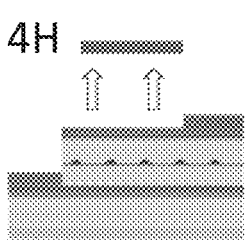
Figure 4I:
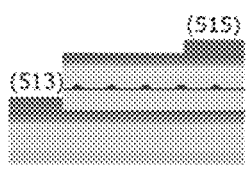
Figure 4J:
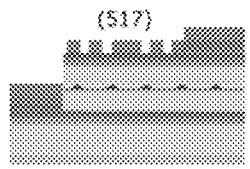
Figure 4K:
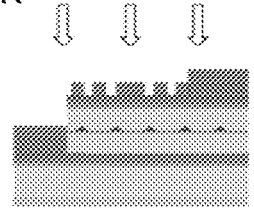

In FIG. 4G, a layer of PdGePtAu is evaporated 511 on the surface. In FIG. 4H, a lift-off process removes the excess of metal, leaving the p-type 513 and n-type 515 contacts. In FIG. 4J a third resist mask 517 is created by following the same procedure illustrated in FIGS. 4A to 4C. Since this mask defines the fine features, ZEP520A resist is used. In FIG. 4K, the fine features are dry-etched using inductively coupled plasma using chlorine chemistry.

Figure 4L:
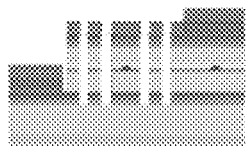
Figure 4M:
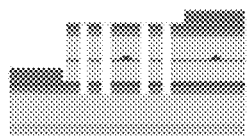

In FIG. 4L, the $SiO_2$ layer acts as an etch stop, eliminating the need of depth calibrations. In FIG. 4M, the residual resist is first exposed to deep UV radiation for a few minutes in order to decompose the polymer and then dissolved at room temperature into Microposit Remover 1165.

FIGS. 5A to 5M are schematic workflows for the fabrication of a device operating in the near infrared or in the telecom O-band starting from the GaAs bonded wafer structure presented in FIGS. 3A to 3F.

Figure 5A:
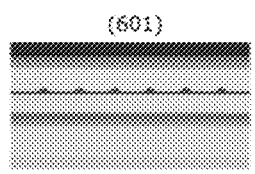
FIGS. 5A to 5M are fabrication steps for patterning the layer structure of FIG. 3F.
Figure 5B:
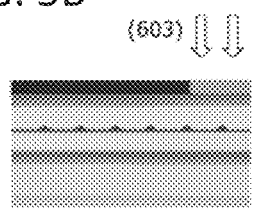
Figure 5C:
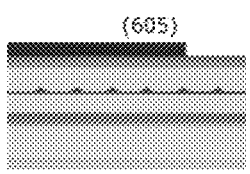

In FIG. 5A, the GaAs slab is covered with a layer of PMMA or ZEP resist 601. In FIG. 5B, exposure to an electron-beam 603 defines the area where the n-type contact will be deposited. In FIG. 5C, the structure is developed in a solvent that removes the exposed resist creating the first mask 605.

Figure 5D:
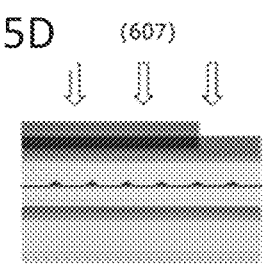
Figure 5E:
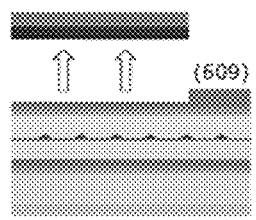

In FIG. 5D, a layer of PdGePtAu is evaporated 607 on the surface over both the mask 605 and exposed portion. In FIG. 5E, a lift-off removes the resist mask, leaving the evaporated metal 607 which forms n-type contact 609.

Figure 5F:
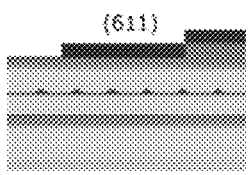
Figure 5G:
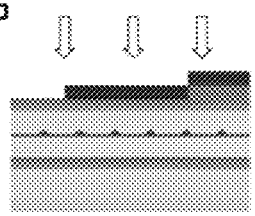
Figure 5H:
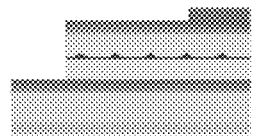

In FIG. 5F, a second resist mask 611 is created by following the same procedure illustrated in FIGS. 5A to 5C. In FIG. 5G, the sample is dry-etched with inductively coupled plasma using chlorine chemistry, stopping at the p-doped layer.

Figure 5I:
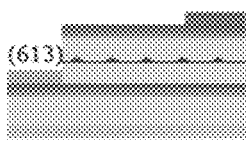

In FIG., 5H, the resist mask is removed by washing the sample in acetone or Microposit Remover 1165. In FIG. 5I, a TiAu or CrAu p-type contact 613 is deposited using the same procedure illustrated in FIGS. 5D and 5E.

Figure 5J:
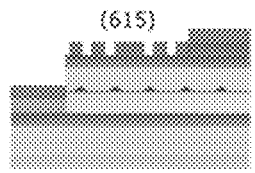
Figure 5K:
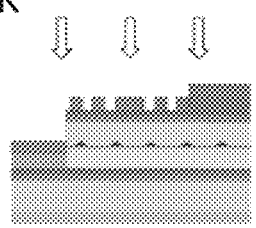

In FIG. 5J, a third resist mask 615 is created by following the same procedure illustrated in FIGS. 5A to 5C. Since this mask defines the fine features, a resist which is good for such high resolution is used such as ZEP520A. In FIG. 5K, the fine features are dry-etched using inductively coupled plasma using chlorine chemistry.

Figure 5L:
Figure 5M:
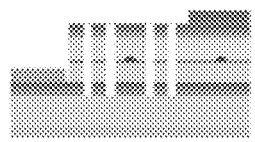

In FIG. 5L, the $SiO_2$ layer acts as an etch stop, eliminating the need of depth calibrations. In FIG. 5M, the residual resist is first exposed to deep UV radiation for a few minutes in order to decompose the polymer and then dissolved at room temperature into Microposit Remover 1165.

Figure 6A:
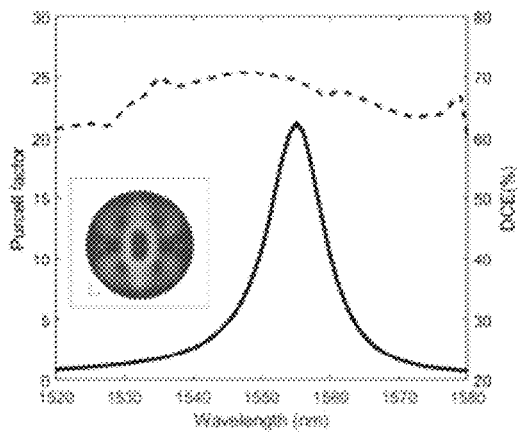
FIGS. 6A and 6B are a plot of Purcell factor against wavelength for two different polarisations, the inset shows the corresponding emission profile.
Figure 6B:
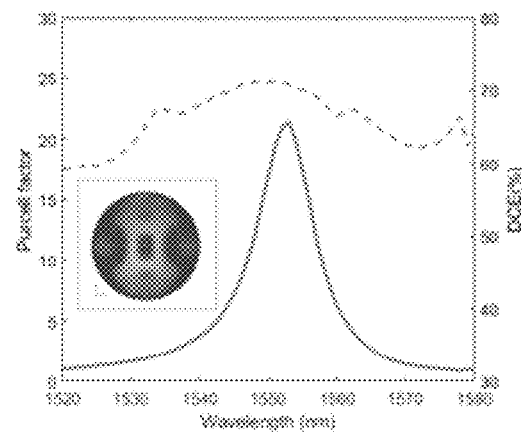

FIGS. 6A and 6B show simulated performance of a device with 5 trenches concentric trenches (width w=350 nm) etched with periodicity a=740 nm. The radius of the central disk is set to R=610 nm and the width of the InP bridges to $w_b$=200 nm. The graphs show the Purcell factor (solid lines) and collection efficiency (DCE) in NA=0.65 (dashed lines) as a function of wavelength calculated for two different polarizations.

In the simulations, the QD are modelled as a dipole in the centre of the device, oriented along a specific direction. The orientation of the dipole defines the orientation of the emitted field and hence the polarisation of the quantum dot. The device with bridges does not have radial symmetry, thus the simulation is performed with the polarisation at different orientations.

The two polarizations simulated here are for two different orientations of the dipole in the device with respect to the 4 bridges: in one case the dipole is parallel/perpendicular to the bridges; in the second case the dipole 'points' at 45 degrees in between two bridges. The insets show the corresponding far-field intensity distribution projected on a sphere, with NA=0.65 represented by the inner circle.

Figure 6C:
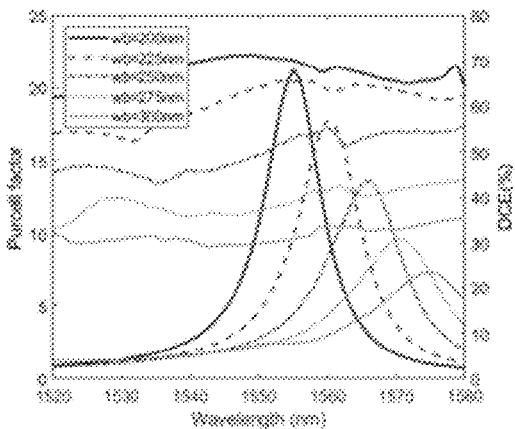
FIG. 6C shows a plot of Purcell factor and DCE in NA=0.65 as a function of wavelength for five different values of the width of the bridge.

FIG. 6C shows the influence of the bridges on the performances of the device: Purcell factor and DCE in NA=0.65 as a function of wavelength for five different values of $w_b$ where $w_b$ is the width of the bridge (200 nm, 225 nm, 250 nm, 275 nm and 300 nm). In this simulation there are 4 bridges.

Figure 6D:
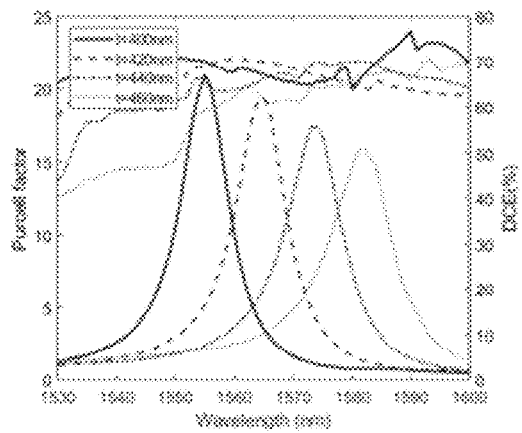
FIG. 6D shows a plot of the value of the Purcell factor and DCE in NA=0.65 as a function of wavelength for five different values of the InP layer.

FIG. 6D shows the influence of the InP thickness on the performances of the device: The plot shows the value of the Purcell factor and DCE in NA=0.65 as a function of wavelength for five different values of $t_{InP}$ (the thickness of the InP layer).

Figure 7A:
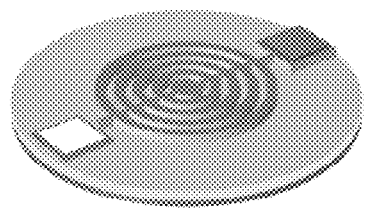
FIGS. 7A, 7B and 7C show plan views of photon sources in accordance with embodiments having different arrangements of bridges.
Figure 7B:
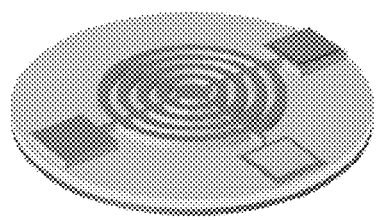
Figure 7C:
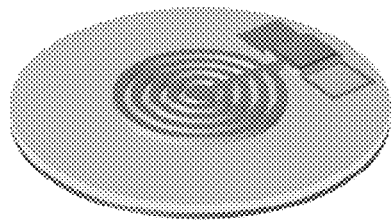

The above examples have pictured a device with four bridges. However, other numbers of bridges are possible, as shown in FIGS. 7A to 7C which show examples of alternative configurations for the electrically driven hybrid CBG. FIG. 7A shows two bridges, FIG. 7B shows three bridges and FIG. 7C, just a single bridge.

Further alternative structures with similar performances can be obtained by increasing the number of semiconductor rings around the central disk. Furthermore, variations of the design parameters (lattice constant, radius of the central disk, width of the trenches, thickness of the layers) are expected to create a shift of the operational wavelength without considerable variations of the performances, for example:

a variation of 20 nm in the slab thickness leads to a ~10 nm wavelength shift in the cavity mode a variation of 10 nm in the radius of the central disk shifts the resonance wavelength by approximately 20 nm the cavity mode moves by approximately 10 nm when the periodicity is changed by 15 nm.

FIGS. 8A to 8D relate to a fibre-pigtailed device using the structure above described with reference to FIGS. 1 to 7.

Figure 8A:
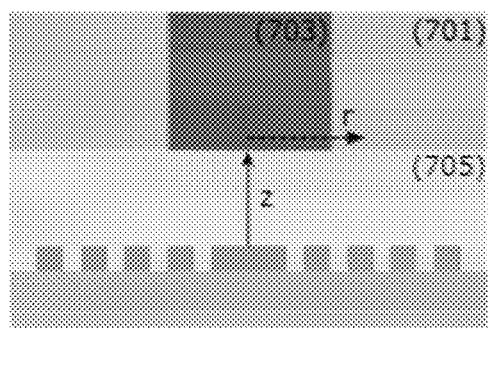
FIG. 8A is a schematic cross section of a photon source in accordance with an embodiment coupled to a fibre.

In FIG. 8A, a single mode optical fibre 701 is positioned on top of the structure of FIGS. 1A and 1B at a vertical distance z. The fibre core 703 is aligned with the central disk of the CBG in the radial direction.

In an embodiment, the fibre is held in position in a vacuum, for example via a mechanical clamp or the like. In a further embodiment, the gap between the CBG and the fibre is filled with an optical adhesive 705 such as NOA81 to hold the fibre in place. If the fibre is held in place via an optical adhesive the design parameters can be re-optimised to compensate for the different refractive index of the optical adhesive.

Figure 8B:
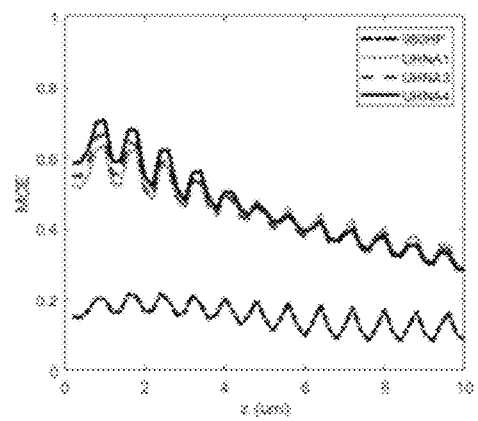
FIG. 8B is a plot showing the simulated mode coupling efficiency (MCE) as a function of the distance z between the fibre and the upper surface of the source for four different types of commercial single mode fibres.

FIG. 8B is a plot showing the simulated mode coupling efficiency (MCE) as a function of the distance z between the fibre and the upper surface of the CBG calculated at $\lambda=1550$ nm for four different types of commercial SM fibres: 980HP; UHNA1; UHNA3 and UHNA4.

Returning briefly to FIGS. 6A and 6B, both FIGS. 6A and 6B have an inset which shows an emission profile for the source. The emission profile is nearly Gaussian and thus allows efficient coupling of the source to a single mode optical fibre.

Figure 8C:
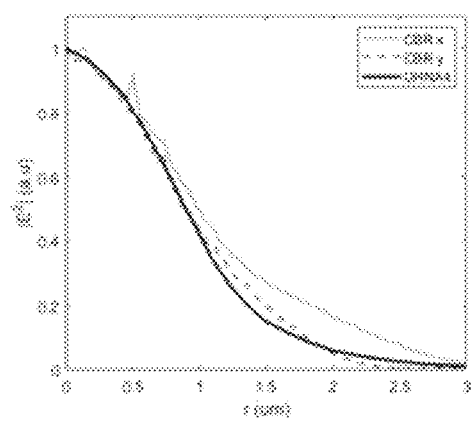
FIG. 8C shows the mode profile of an Nufern UHNA4 fibre (solid line) and the spatial profile of the near-field emission from the CBG along the x and y axis (dashed lines) at different fibre radii.

FIG. 8C shows a comparison between the mode profile of an Nufern UHNA4 fibre (solid line) and the spatial profile of the near-field emission from the CBG along the x and y axis (dashed lines) calculated for z=1.6 μm. The thick black line of the mode of the fibre is similar in profile to the Gaussian-like emission profile from the photon source. This allows very efficient coupling from the source to the fibre.

Figure 8D:
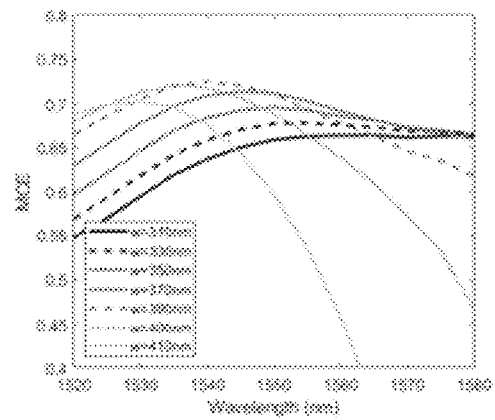
FIG. 8D shows the simulated mode coupling efficiency (MCE) into UHNA4 SM fibre as a function of wavelength for different widths w of the trenches.

FIG. 8D shows the simulated mode coupling efficiency (MCE) into UHNA4 SM fibre as a function of wavelength for different widths w of the trenches. The efficiency is calculated for z=1.6 μm.

It should be noted that the data shown in FIGS. 8B to 8D are based on simulations performed with a simplified computational model that does not take into account the presence of the bridges.

Figure 9:
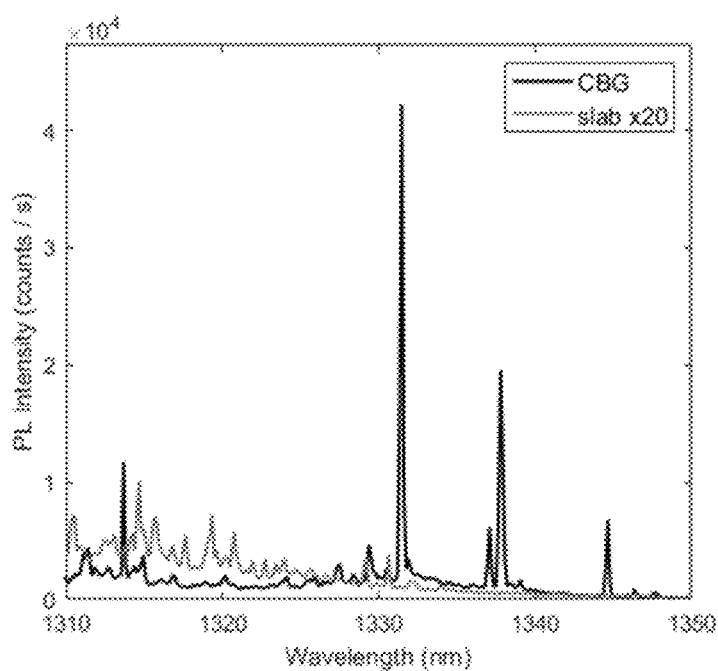
FIG. 9 is a plot showing photoluminescence (PL) signal from a QD embedded into a GaAs hybrid circular Bragg reflector compared to the micro-PL signal recorded on an unpatterned area of the same chip.

FIG. 9 is a plot showing photoluminescence (PL) signal from a QD embedded into a GaAs hybrid CBG under 250 nW CW laser excitation (black) compared to the micro-PL signal recorded on an unpatterned area of the same chip 3 μW CW laser excitation (grey). The PL intensity from the unetched slab is multiplied by a factor of 20.

The GaAs CBG is designed to have Purcell factor $F_p=20$ and 86% collection efficiency in NA=0.65. Therefore, this measurement gives an idea of the enhancement expected from the electrically driven device of FIGS. 1 to 6.

The above device is a variation of a hybrid CBG structure- which is also compatible with electric field control.

As shown FIGS. 1A and 1B, the device is fabricated on an InP slab with quantum dots (QDs). The slab includes a n-InP layer and a p-InP layer creating a PIN diode structure. The above device design does not present fully etched circular trenches. Instead, the trenches are interrupted by InP bridges that connect the central disk to the surrounding semiconductor where the metal contacts are deposited.

The above device enables electric field control. FIG. 6 shows how the device maintains the combination of moderate Purcell enhancement and high extraction efficiency in a broad wavelength range demonstrated by the conventional hybrid CBG.

Small adjustments of the layer thicknesses and the fine features, allow the design to be easily transferred to the GaAs material system to obtain a device operating in the near infrared or in the telecom O-band.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A photon source comprising:
a quantum dot; and an optical cavity,
the optical cavity comprising:
a diffractive Bragg grating "DBG"; and
a planar reflection layer,
the DBG comprising a plurality of concentric reflective rings surrounding a central disk and at least one conductive track extending from the central disk across the plurality of concentric rings, the quantum dot being provided within the central disk and the planar reflection layer being provided on one side of the DBG to cause light to be preferentially emitted from the opposing side of the DBG.

2. The photon source of claim 1, wherein the planar reflection layer is a metal reflection layer.

3. The photon source of claim 1, wherein the quantum dot is provided in a semiconductor layer and a dielectric spacer layer is provided between the quantum dot and the planar reflection layer.

4. The photon source of claim 3, wherein the plurality of reflective rings comprise a plurality of trenches.

5. The photon source of claim 4, wherein the quantum dot is provided in an undoped semiconductor layer, the undoped semiconductor layer being provided between a first-doped semiconductor layer and a second doped semiconductor layer, the trenches extending through the undoped semiconductor layer, the first doped semiconductor layer and the second doped semiconductor layer, the at least one conductive track being provided by bridge of semiconductor material comprising at least one of the first doped semiconductor material and/or the second doped semiconductor material.

6. The photon source of claim 5, wherein the trenches are etched trenches and the bridge of semiconductor material is a non-etched region.

7. The photon source of claim 6, wherein the trenches extend into the dielectric spacer layer and the dielectric spacer layer functions as an etch stop layer.

8. The photon source of claim 6, wherein the first doped layer is n-type doped layer and an n-type contact is provided to the n-type doped layer and the second doped layer is a p-type doped layer and a p-type contact is provided to the p-type doped layer at the edge of the outermost concentric ring.

9. The photon source of claim 5, wherein there are a plurality of bridges extending from said central disk in a radial manner.

10. The photon source of claim 9, wherein the plurality of bridges are arranged rotationally symmetric around the central disk.

11. The photon source of claim 5, wherein a width of a bridge is at least 150 nm and at most 500 nm.

12. The photon source of claim 5, wherein a width of the trenches is at least 50 nm and at most 600 nm.

13. The photon source of claim 5, further comprising an optical fibre positioned to collect radiation emitted from the quantum dot.

14. The photon source of claim 5, wherein each of the undoped semiconductor layer, the first doped semiconductor layer and the second doped semiconductor layer comprises GaAs or InP.

15. The photon source of claim 5, wherein a width of a bridge is constant along a radius of the concentric rings.

16. The photon source of claim 1, wherein the quantum dot is configured to emit radiation having a wavelength of 700 nm to 2000 nm.

17. The photon source of claim 1, wherein the quantum dot is configured to confine an electron-hole pair whose energy levels are quantized, the electron-hole pair providing an exciton state such that the quantum dot is configured to emit a polarization entangled photon when the electron-hole pair recombines; and wherein the central disk comprises a first doped semiconductor layer and a second doped semiconductor layer, wherein a conductive track of the at least one conductive track contacts the first doped semiconductor layer and the second doped semiconductor layer such that the conductive track is configured to apply an electric field across the quantum dot.

\* \* \* \* \*